US006693022B2

United States Patent
Dreybrodt et al.

(10) Patent No.: US 6,693,022 B2
(45) Date of Patent: Feb. 17, 2004

(54) CVD METHOD OF PRODUCING IN SITU-DOPED POLYSILICON LAYERS AND POLYSILICON LAYERED STRUCTURES

(75) Inventors: Joerg Dreybrodt, Bremen (DE); Dirk Drescher, Langebrueck (DE); Ralf Zedlitz, Dresden (DE); Stephan Wege, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/226,764

(22) Filed: Aug. 23, 2002

(65) Prior Publication Data

US 2003/0017684 A1 Jan. 23, 2003

Related U.S. Application Data

(60) Division of application No. 09/884,188, filed on Jun. 19, 2001, now Pat. No. 6,479,373, which is a continuation-in-part of application No. 09/026,659, filed on Feb. 20, 1998, now abandoned.

(30) Foreign Application Priority Data

Feb. 20, 1997 (DE) .......................................... 197 06 783

(51) Int. Cl.$^7$ ............................................. H01L 21/205
(52) U.S. Cl. ...................... 438/491; 438/592; 438/655; 438/657; 438/680
(58) Field of Search .................. 438/488, 491, 438/592, 655, 656, 657, 680, 683, 684

(56) References Cited

U.S. PATENT DOCUMENTS

| 4,460,416 A | 7/1984 | Wonsowicz |
| 5,094,712 A | 3/1992 | Becker et al. |
| 5,147,820 A | * 9/1992 | Chittipeddi et al. ........ 438/592 |
| 5,310,453 A | 5/1994 | Fukasawa et al. |

(List continued on next page.)

FOREIGN PATENT DOCUMENTS

| CN | 1135656 A | 11/1996 |
| DE | 44 25 351 A1 | 3/1995 |

(List continued on next page.)

OTHER PUBLICATIONS

Dai et al.: "Characteristics of Two–Step Continuous Deposition of In Situ Doped and Undoped Polycrystalline Silicon", J. Electrochem. Soc., vol. 140, No. 1, Jan. 1993, pp. L9–L12.

(List continued on next page.)

*Primary Examiner*—Carl Whitehead, Jr.
*Assistant Examiner*—Stephen W. Smoot
(74) *Attorney, Agent, or Firm*—Laurence A. Greenberg; Werner H. Stemer; Ralph E. Locher

(57) ABSTRACT

Doped polysilicon layers and layered polysilicon structures are produced, and the layers and layered structures are structured. The doping is distinguished by the fact that the doping compound is added as a process gas during the chemical vapor deposition of the polysilicon to define the doping profile. The feed of dopant to the process gas is stopped toward the end of the vapor deposition, with the result that a boundary layer of undoped silicon is deposited. As a result, a favorable surface quality and better adhesion to a neighboring layer is obtained. The structuring process comprises an at least three-step etching process in which a fluorine containing gas is used for etching in a first step, a chlorine-containing gas is used for etching in a second step and a bromine-containing gas is used for etching in a third step. The invention also encompasses wafers and semiconductor chips produced with the novel doping and/or structuring method.

17 Claims, 7 Drawing Sheets

U.S. PATENT DOCUMENTS

| | | | |
|---|---|---|---|
| 5,336,365 A | | 8/1994 | Goda et al. |
| 5,346,586 A | | 9/1994 | Keller |
| 5,376,235 A | | 12/1994 | Langley |
| 5,660,681 A | | 8/1997 | Fukuda et al. |
| 5,789,030 A | * | 8/1998 | Rolfson .................. 427/309 |
| 5,849,629 A | * | 12/1998 | Stamper et al. ............ 438/491 |
| 5,948,703 A | | 9/1999 | Shen et al. |
| 5,981,364 A | * | 11/1999 | Ramsbey et al. ........... 438/592 |
| 6,093,589 A | * | 7/2000 | Lo et al. .................... 438/197 |
| 6,335,280 B1 | * | 1/2002 | van der Jeugd ............ 438/674 |
| 6,362,111 B1 | | 3/2002 | Laaksonen et al. |

FOREIGN PATENT DOCUMENTS

| | | |
|---|---|---|
| EP | 0 124 960 A2 | 11/1984 |
| EP | 0 466 166 A1 | 1/1992 |
| EP | 0 529 952 A1 | 3/1993 |
| EP | 0 772 231 A2 | 5/1997 |
| GB | 2 286 802 A | 8/1995 |
| JP | 4-142737 A | 5/1992 |
| WO | WO 96/27899 | 9/1996 |

OTHER PUBLICATIONS

Fracassi et al.: "Plasma Assisted Dry Etching of Cobalt Silicide for Microelectronics Applications", J. Electrochem. Soc., vol. 143, No. 2, Feb. 1996, pp. 701–707.

IBM Technical Disclosure Bulletin: "Method for Suppressing Diffusion of Dopant from Doped Polysilicon to Silicide", vol. 32, No. 6A, Nov. 1989, pp. 206–207.

IBM Technical Disclosure Bulletin: "Integrated In–Situ Polysilicon/Tungsten Silicide Gate Conductor", vol. 38, No. 6, Jun. 1995, pp. 115–116.

Anonymous: "Process for forming Tungsten Silicide with Good Adhesion to Doped Polycrystalline Silicon", XP002105557, Research Disclosure No. 28924, May 1988.

Kow–Ming Chang et al.: "Highly selective etching for polysilicon and etch–induced damage to gate oxide with halogen–bearing electron–cyclotron–resonance plasma", J. Appl. Phys. 80 (5), Sep. 1996, pp. 3048–3055.

* cited by examiner

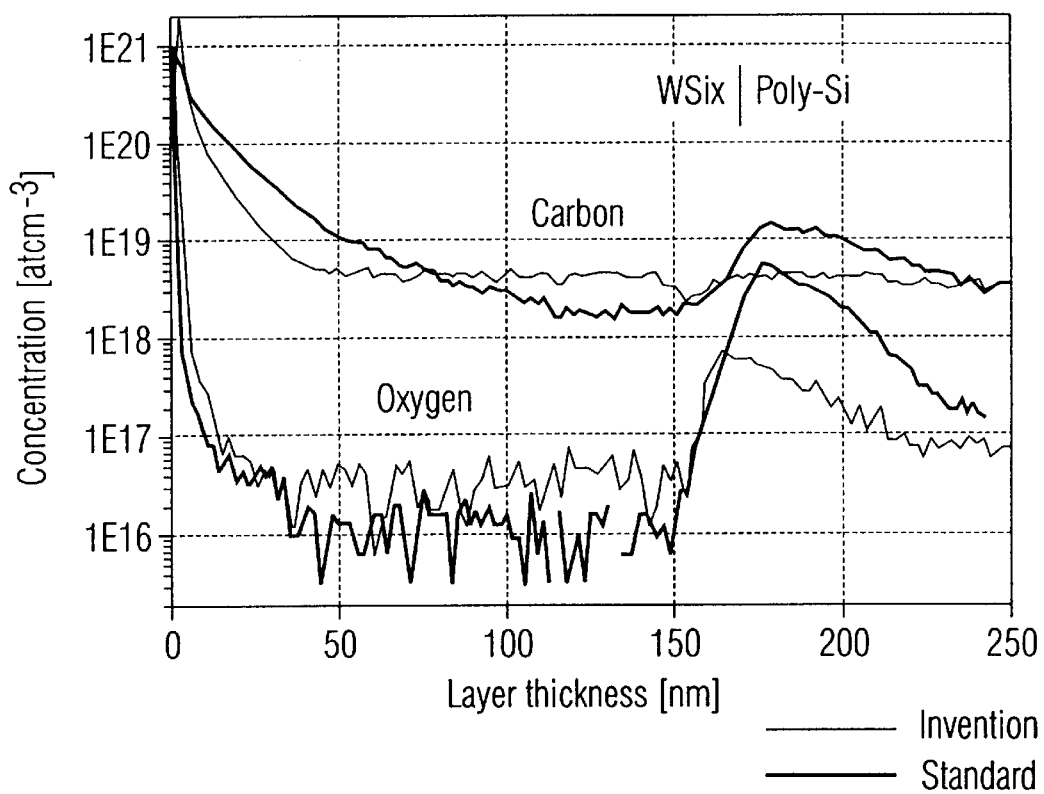

End point algorithm for main etching step

| Etching mode; end point-depth | End point | End point | NO | NO |
|---|---|---|---|---|
| Wavelength/nm (2000 - 8000, 0 for NO) | 4705 | | | |
| Initial dead time (0.0 - 999.9) | 5.0 | | | |
| Window height (-99.99 - 99.99) | -1.00 | -0.65 | -0.10 | -0.10 |
| Window time/s (0.1 - 99.99) | 2.0 | 0.7 | 10.0 | 10.0 |
| No. of windows off (1-99, o for NO) | 8 | NO | NO | NO |
| No. of windows on (1-99, o for NO) | NO | 5 | NO | NO |
| Overetching (0% - -999%) | 0 | | | |

| Etching mode; end point-depth | End point | End point | End point | NO |
|---|---|---|---|---|
| Wavelength/nm (2000 - 8000, 0 for NO) | 4705 | | | |
| Initial dead time (0.0 - 999.9) | 20.0 | | | |
| Window height (-99.99 - 99.99) | 0.50 | 1.0 | 2.5 | -0.10 |
| Window time/s (0.1 - 99.99) | 3.0 | 8.0 | 30.0 | 10.0 |
| No. of windows off (1-99, o for NO) | 5 | NO | NO | NO |
| No. of windows on (1-99, o for NO) | NO | 4 | 1 | NO |
| Overetching (0% - -999%) | 0 | | | |

CVD METHOD OF PRODUCING IN SITU-DOPED POLYSILICON LAYERS AND POLYSILICON LAYERED STRUCTURES

CROSS-REFERENCE TO RELATED APPLICATION

This application is a division of U.S. application Ser. No. 09/884,188, filed Jun. 19, 2001, granted as U.S. Pat. No. 6,479,373, which was a continuation-in-part of U.S. application Ser. No. 09/026,659, filed Feb. 20, 1998, now abandoned.

BACKGROUND OF THE INVENTION

Field of the Invention

The invention relates to a method of producing doped polysilicon layers and polysilicon layered structures.

In particular, the invention relates to the fabrication of gate electrodes of transistors and of word lines in microelectronic components. The methods which are usually used for this comprise the successive deposition of four layers, namely gateoxide ($SiO_2$), polycrystalline silicon (generally referred to in short as polysilicon), metal and/or metal silicide and a barrier layer (for example $SiO_2$).

In order to ensure the necessary conductivity, the polysilicon layer is usually doped with doping atoms at high concentrations. In this process, a uniform distribution of the doping atoms over the polysilicon layer is very important. Otherwise, the adhesion of a doped polysilicon layer and adjacent metal (silicide) layer is not sufficient and the highly-doped polysilicon can only be structured with extreme difficulty when the doping level highly fluctuates.

In a particularly frequently used method, the procedure adopted in the context of such layered structures is such that it is only after the structuring of the layered structure by means of an etching procedure that the doping of the polysilicon layer is carried out. The doping atoms are thereby injected into the polysilicon from the adjacent metal silicide layer by heat treatment. It is virtually impossible to achieve uniform distribution of the doping atoms in this way. Another possibility is to add the doping compound to the process gas during the chemical vapor deposition and to deposit the doping atoms together with the silicon. In this way, a more uniform distribution of the doping atoms is attained, but the surface quality and adhesion to adjacent layers is not optimal with the conventional way of carrying out this method.

The adhesion problems between the layers can be eliminated to a certain extent by means of additional cleaning steps before the neighboring layer is applied. Such cleaning steps are however time-consuming and make the fabrication of the semiconductor components more expensive. The quality of the boundary layer (for example changes as a result of oxidization in air) also plays a decisive role in the electrical characteristics.

Difficulties arise with the structuring of the layers owing to different material properties of the individual layers on the one hand, and to concentration fluctuations within a layer on the other hand. It would be desirable to have straight-etched edges over all the layers with the lowest possible degree of damage to the gate oxide as a result of the etching process over the entire surface of the wafer, in order to ensure satisfactory quality of the micro-electronic components. The prior art methods do not fulfill these requirements to a satisfactory degree. On the one hand, the layer thicknesses have to be relatively great owing to the low selectivity of the known etching methods, in order to avoid undercutting of the layers and damage to the gate oxide. For this reason, it is virtually impossible to realize very flat layered structures. The homogeneity of the etching procedure over the area to be etched and the structure of the etched edges are not completely satisfactory either.

Precise structuring of a layered structure requires not only uniform quality of the individual layers within the structure but also a structuring method which runs over a plurality of steps which are selectively adapted to the material properties of the layered structure.

SUMMARY OF THE INVENTION

It is accordingly an object of the invention to provide a method of producing doped layers which are mainly composed of polycrystalline silicon which is deposited in a chemical vapor deposition, which overcomes the above-mentioned disadvantages of the heretofore-known devices and methods of this general type and in which the doping material is distributed homogeneously over the entire deposited area and the surface quality and adhesion to an adjacent layer is optimized. It is a further object to provide for processing which is simple and cost-effective and which may be carried out with conventional method steps and devices.

It is again a further object of the invention to provide a method by means of which layered structures which comprise at least one polysilicon layer and in particular one doped polysilicon layer and a metal layer or metal silicide layer can be structured with the highest possible degree of selectivity and homogeneity over the area to be structured, forming etched edges which are as straight as possible over all the etched layers. The selectivity should be high enough to permit the thickness of the layers in the layered structure to be reduced, and thus to permit flat microelectronic components to be fabricated.

With the foregoing and other objects in view there is provided, in accordance with the invention, a method of producing a doped layer primarily composed of polycrystalline silicon, and a method of producing layered structures which include such a doped layer. The method comprises:

forming a polycrystalline silicon layer on a substrate by chemical vapor deposition and doping the layer by adding a doping compound to a process gas during the chemical vapor deposition; and doping only during a determined deposition period in the forming step and terminating a feed of the doping compound to the process gas while continuing the chemical vapor deposition and forming a layer of substantially undoped silicon as a boundary layer of the doped polysilicon layer.

The novel process makes it possible to fabricate uniformly doped polysilicon layers which can be structured much more easily and better than polysilicon doped in a conventional way. Also, the surface quality and adhesion to an adjacent layer is improved.

With the above objects in view there is also provided a method of structuring a layered structure formed of at least one metal layer or metal silicide layer disposed on a polycrystalline silicon layer, which comprises a three-step process including:

etching with fluorine-containing gas in a first step;
  etching with a chlorine-containing gas in a second step; and
  etching with a bromine-containing gas in a third step.

Particularly good results can be achieved if both methods are combined with one another to fabricate wafers and semiconductor chips.

Therefore, the invention also relates to wafers and semiconductor chips produced with one or both methods according to the invention. They are defined as a semiconductor structure, comprising:

a substrate;

a doped polysilicon layer deposited on the substrate and doped in a chemical vapor deposition process;

a substantially undoped boundary layer contiguously formed on the doped polysilicon layer in the chemical vapor deposition process.

In accordance with another mode of the invention, the etching steps comprise etching the metal or metal silicide layer disposed on a boundary layer of substantially undoped silicon disposed on a doped polysilicon layer.

In accordance with an added feature of the invention, the doped polysilicon layer is formed directly on a gate oxide layer.

The doped layers referred to herein are composed mainly of polycrystalline silicon deposited by means of chemical vapor deposition (CVD). These layers are referred to herein in short as doped polysilicon layers for the sake of simplicity.

According to the invention, the layer is doped during its formation by adding the doping compound as a process gas during the chemical vapor deposition of the polycrystalline silicon. In other words, the doping takes place simultaneously with the deposition of the polycrystalline silicon. Compared with the implantation method, special steps for cleaning the polycrystalline silicon before the implantation of the doping atoms and for the implantation of the doping substances themselves are eliminated. As a result, not only can the fabrication time be considerably shortened but also there can be a saving in terms of clean room area. The method according to the invention is thus extremely cost-effective. In addition, it does not require any additional doping devices whatsoever. Furthermore, the in situ doping enables the defect density level and the concentration of impurities to be greatly reduced, which is extremely advantageous in terms of the further processing and also with respect to the reliability of the finished microelectronic component.

In contrast with the conventional CVD doping methods, the method according to the invention is carried out in such a way that the feeding of doping compound to the process gas is terminated toward the end of the method, i.e. after the desired deposition period has expired and the desired concentration of doping atoms has been achieved. As a consequence of this, a boundary layer of undoped polysilicon is deposited on the doped polysilicon. This leads to a considerably better surface quality in comparison with the doped polysilicon being obtained.

This is advantageous for the structuring of the layer and the adhesion to an adjacent layer.

However, the layer composed of undoped polysilicon improves not only the adhesion of the adjacent layer but can also increase the homogeneity of the stoichiometry in the metal silicide layer. This is of particular significance in the boundary surface region of strongly metal-doped polysilicon layers. For example, in the case of tungsten silicide layers with strong tungsten enrichment it has been observed that a stoichiometric equalization occurs during subsequent high-temperature processing steps. Silicon atoms migrate from adjacent regions into the regions which have been strongly enriched with tungsten, and thus give rise to microholes in the adjacent region.

The application of a "clean", i.e. undoped, polysilicon layer prevents the occurrence of this phenomenon in the boundary surface region and thus ensures that there is a high degree of stoichiometric homogeneity over the entire layer thickness of the metal silicide layer.

Therefore, the deposition of adhesion-promoting layers composed of undoped polysilicon and the production of the doped polysilicon layer can be achieved according to the invention in one operation by suitably setting the concentration of the doping compound in the process gas.

Basically, all atoms of the p-type and n-type which are usual for doping polycrystalline silicon, such as boron, gallium, indium, phosphorus, arsenic, and antimony, are possible as doping atoms. Since the doping atoms are fed to the chemical vapor deposition of the polysilicon in the form of their compounds as a process gas, it is expedient to use compounds which are in gaseous form or which are highly volatile. For example, diborane ($B_2H_6$), trimethylboron ($B(CH_3)_3$), phosphane ($PH_3$) and arsane ($AsH_3$) are suitable gases.

The doping compounds break down under the process conditions, and the doping atoms are deposited together with the silicon, and are embedded in the polysilicon layer.

The doping compound can be added to the gas stream from the beginning to a proportion which is constant over the entire vapor deposition and which is selected in accordance with the desired ratios of quantities of doping atoms in the polysilicon layer.

In addition, it is possible to keep the ratio of the doping compound and Si-containing compound constant with respect to one another, but to increase the proportion of them in the gas continuously or incrementally in the course of the deposition.

In order to obtain a good thickness homogeneity of the deposited layer over the wafer surface, it may be advantageous to dope with a concentration gradient. A suitable doping profile may be obtained, for example, where the concentration of the doping compound, relative to the overall quantity of fed-in, deposited compounds, is increased in the course of the deposition method.

Advantageously, the deposition of pure silicon is started first, since then the adhesion on the underlying surface is generally better, and then the doping compound is fed in and its concentration increased continuously or incrementally until the desired concentration of doping atoms in the polysilicon is achieved.

On the other hand, it is also possible firstly to add the doping compound to the quantity corresponding to the desired final concentration of doping atoms in the silicon, and to increase the proportion of silicon-containing compound in the gas stream as the vapor deposition progresses.

The method according to the invention can be used to deposit doped polysilicon layers on a wide variety of substrates. The method according to the invention is particularly suitable for fabricating gate electrodes of transistors and word lines of a semiconductor component.

Here, the doped polysilicon layer is deposited, for example, in the manner described above, on the gate oxide layer which is usually composed of silicon dioxide. Subsequently, a layer of metal or metal silicide can be applied to the doped polysilicon layer with the boundary layer made of pure polysilicon. The metal silicide is expediently also applied by means of chemical vapor deposition. It is advantageous in this case that it is possible to employ the same device as that used for depositing the polysilicon layer, but it is expedient to use a different deposition chamber than that for the deposition of the polysilicon. In this way, the fabrication of the gate electrodes and word lines can be carried out particularly simply and economically. All the compounds which are usually used in the case of microelectronic components, and in particular the silicides of cobalt, titanium, tantalum, molybdenum and tungsten, are suitable as metal silicide.

Subsequently, an insulation or barrier layer can also be applied to the metal silicide layer. Here, all the insulation layers which are usually used in microelectronic components are suitable. Insulation layers composed of silicon dioxide and silicon nitride, and here, in particular, so-called TEOS or cap-TEOS layers, which are produced by vapor deposition of tetraethoxysilane are particularly suitable.

Particularly good results in terms of the quality of the layers within the layered structure can be achieved if one or more of the layering steps, and in particular the application of the doped polysilicon layer, can be carried out in a vacuum or high vacuum. It is advantageous if, in particular, the vacuum is maintained when the wafer is transferred from one chamber of the CVD device into the next. For example, the vacuum is therefore expediently not interrupted between the chamber for the polysilicon deposition and that for the metal silicide deposition.

If a layer composed of silicon dioxide or silicon nitride is applied as barrier layer to the layered structure, said barrier layer may serve, in the structuring method according to the invention, as a mask for the etching of the layers lying underneath.

In accordance with an additional feature of the invention, a layered structure with at least one metal layer or metal silicide layer on a layer composed of polycrystalline silicon may be structured.

As already mentioned, the structuring of such layered structures generally presents great difficulties. This is the case if, in particular, the polysilicon layer is a doped layer and, in particular, a layer with doping gradients. It has previously been virtually impossible to structure such layered structures selectively and to form straight etching edges. The method according to the invention remedies this.

As noted, the invention is distinguished by the fact that the etching procedure includes at least three steps, the first step of which uses a fluorine-containing etching gas, the second a chlorine-containing gas, and the third a bromine-containing gas.

In the prior art, two-step etching methods were previously usual for the above-mentioned layered structures.

As a result of the suitable selection of the etching agent and as a result of their being matched to the layers to be structured, extremely selective etching of the individual layers, during which overetching and undercutting can largely be avoided, is successfully carried out.

The etching procedure can be controlled either by selecting a suitable fixed etching period or by determining an end point. In particular a spectroscopic method is suitable for end-point control of one or more of the etching steps. Optical emission spectroscopy (OES), during which the concentration of an etching agent or etching product, which has been determined by means of its emission, provides information on the progress of the etching procedure, is particularly suitable. In this way, the end point of the individual etching steps can be determined very precisely, and precise monitoring of the respective etching processes is ensured.

Furthermore, the residual layer thickness of the layer to be etched can also be ascertained using a spectroscopic method.

In the first step, which can also be referred to as "breakthrough", a large part of the metal layer or metal silicide layer is etched away with the fluorine-containing etching gas. Only a remainder of the layer, for example approximately 25% of the original layer thickness, is retained. In the subsequent second step—the main etching step "main etch",—the residual metal layer or metal silicide layer, and a large part of the polysilicon layer lying underneath, are etched away with chlorine-containing etching gas. The second step is preferably carried out in such a way that a small remainder of the polysilicon layer is retained, for example with a layer thickness of approximately 50 nm. The residual layer thickness of the polysilicon is preferably determined by means of OES. The residual polysilicon is selectively etched away in the third step, the so-called "overetching step". Bromine-containing etching gas is used for this. The use of the bromine-containing etching gas ensures a high degree of selectivity in this method step and largely prevents the layers lying underneath the polysilicon layer from being attacked. Furthermore, the bromine-containing chemical has the advantage in the overetching step that the metal silicide cannot be undercut. In this way, overetching times of virtually any desired length are possible. This is of great importance in the reduction of transistor dimensions and of the relatively large topography of the underlying surface. This method is particularly suitable if there is a gate oxide layer of silicon dioxide underneath the polysilicon layer. The method according to the invention can therefore be used advantageously on layered structures which comprise layers in the sequence of gate oxide, polysilicon, metal layer or metal silicide layer and barrier layer.

The method according to the invention is suitable for layered structures with a polysilicon layer which may be doped or undoped. Particularly good results are achieved if, in the case of a doped polysilicon layer, the doping takes place in accordance with the doping method described at the beginning. The layered structures fabricated according to the method explained above are particularly well suited to structuring according to the structuring method in accordance with the invention. Because of the high degree of selectivity of the structuring method according to the invention and the excellent homogeneity over the entire area of the layers to be structured, it is possible to reduce the thickness of the individual layers in the layered structure without overetching of the respective layers occurring. This is carried out particularly successfully by means of end-point control of the etching procedure using spectroscopic methods and, in particular, using OES. The avoidance of overetching relates not only to the layers to be structured but also to the layers lying underneath, that is to say to the gate oxide layer, for example. This means that the overall thickness of the layered structure can be significantly reduced. On the one hand, this permits relatively flat microelectronic components to be manufactured and, on the other hand, it is possible to arrange further layers, such as metallization layers or the like over the etched layered structure without exceeding the permissible overall height of a microelectronic component.

The structuring of the layered structure, which comprises at least one metal layer or metal silicide layer on a polysilicon layer, can basically be carried out using the masks usually employed for structuring. For example, the usual resist masks made of photoresistor or the like can be used. However, the structuring is preferably carried out using a hard mask which is applied to the metal layer or metal silicide layer. A mask made of silicon dioxide or silicon nitride is preferably used as hard mask. The silicon dioxide layer can be so-called (Cap)-TEOS, that is to say silicon dioxide, which has been produced from tetraethoxysilane by means of a CVD method. This mask is preferably fabricated from the barrier layer which has been applied as top layer of the layered structure on the metal layer or metal silicide layer. By using such a hard mask, which may be relatively thin, the overall height of the layered structure can be reduced further.

The barrier layer is structured in the usual way. For example, a structured resist mask is initially applied to the barrier layer. Then, the layer is opened with a suitable etching agent. In the case of layers of silicon dioxide or silicon nitride this can be carried out, for example by means of plasma etching with argon, trifluoromethane and oxygen. The structuring of the hard mask is expediently carried out in a different chamber of the etching device from that used for the following three-step or multi-step etching method.

The at least three steps of the etching method for the layers lying underneath the hard mask are preferably carried out in one and the same chamber of the etching device. The etching device can be any of the devices conventionally used for this purpose.

The etching gas used in the first etching step comprises at least one fluorine-containing compound. Preferred fluorine-containing etching gases comprise $NF_3$, $SF_6$, $SiF_4$ or mixtures thereof. Fluorinated hydrocarbons, such as $CF_4$, $CHF_3$ and the like can also be used alone or in a mixture with one or more of the fluorides mentioned above. An etching gas mixture which is preferably used is composed of $NF_3$, HCl, $Cl_2$, He and $O_2$.

A chlorine-containing etching gas is used in the second etching step, which gas can comprise, for example, one or more of the compounds HCl, $Cl_2$ and $BCl_3$. A preferred etching gas is composed of HCl, $Cl_2$, He, and $O_2$.

A bromine-containing gas is used as the etching gas of the third step. Hydrogen bromide serves, for example, as the bromine compound. An etching gas which is composed of HBr, He and $O_2$ is suitable.

In one embodiment, in the third step where a bromine-containing gas is used as the etching gas, a bromine component is essentially the only halogen etching measure.

In another embodiment, in the second step where a chlorine-containing etching gas is used as the etching gas, a chlorine component is essentially the only halogen etching measure.

In another embodiment, in the second step where a chlorine-containing etching gas is used as the etching gas, a chlorine component is substantially the only halogen etching measure.

In another embodiment, in the third step where a bromine-containing gas is used as the etching gas, there is no other halogen element present other than bromine.

The structuring method according to the invention can be used to remove the polysilicon layer, virtually without residue, in the regions which are not protected by the mask, without the underlying layers, that is to say for example the gate oxide layer, being damaged. Traces of impurities or etching residues which may still be present can, if appropriate, be removed by means of a wet-chemical cleaning step adjoining the etching steps. A diluted, aqueous solution of hydrogen fluoride, for example in the ratio of HF to $H_2O$ of 1:100 to 200, for example, is suitable for this.

With the structuring method according to the invention, a degree of homogeneity and selectivity which is improved in comparison with the known method is achieved when etching the individual layers in the layered structure. The etching of the layered structure is carried out virtually free of residues and without damage to adjacent layers. The excellent selectivity permits the layers of the layered structure to be made thinner than was previously possible, thus allowing the overall height of microelectronic components to be reduced. In addition, the etching method requires an overall etching time period which is decreased in comparison with the method of the prior art.

Furthermore, straight-etched edges are obtained. This can be achieved particularly advantageously if the wafer to be structured is not held mechanically, but rather electrostatically, in the etching device. Usually, a wafer is mounted in the etching chamber by clamping it mechanically and pressing it onto a seal which is arranged at a particular distance from the cathode of the etching chamber. Between the wafer and the cathode, the thermal contact is produced from a gas, for example helium, under pressure (for example 8 torr). However, in this way the wafer is only secured at the edge and can sag in the inner region, with the result that there are different distances between the edge of the wafer and the cathode, and between the interior of the wafer and the cathode. This leads to non-homogeneous etching results, since the conductance of heat depends both on the pressure of the helium and on the distance between the wafer and cathode.

For this reason, according to the invention the wafer is held electrostatically by setting a specific voltage which, as a rule, lies between 1000 and 1500 V. A gas, generally helium, is passed through channels formed in the cathode, with the result that a type of gas cushion is produced between the cathode and wafer. This way of holding the wafer electrostatically is referred to below as electrostatic chuck. The electrostatic chuck has the effect that straight edges are etched over the entire surface of the wafer. The important factor here is that a uniform distribution of temperature is produced over the entire wafer. In addition, the clamp device which was usual before does not exert any disruptive influences on the plasma in the direct vicinity of the edge of the wafer. Furthermore, a reduction in the particle density can be achieved in this way.

With the above and other objects in view there is also provided, in accordance with the invention, a semiconductor structure, comprising:

a substrate;

a doped polysilicon layer deposited on the substrate and doped in a chemical vapor deposition process;

a substantially undoped boundary layer contiguously formed on the doped polysilicon layer in the chemical vapor deposition process.

In accordance with an additional feature of the invention, a gate oxide layer is disposed underneath the doped polysilicon layer.

In accordance with another feature of the invention, the polysilicon layer has a doping profile starting with substantially pure silicon on a substrate side thereof and merging into doped polysilicon.

In accordance with a concomitant feature of the invention, there is provided a layer of a material selected from the group consisting of metal and metal silicide disposed on the boundary layer. The metal silicide selected from the group of cobalt, titanium, tantalum, molybdenum and tungsten silicide.

Other features which are considered as characteristic for the invention are set forth in the appended claims.

Although the invention is illustrated and described herein as embodied in a method of producing doped polysilicon layers and polysilicon layered structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a graph showing a concentration profile illustrating a distribution of oxygen and carbon comparing layered structures produced by the method according to the invention and by a conventional method;

DESCRIPTION OF THE PREFERRED EMBODIMENTS

Figure 2A:
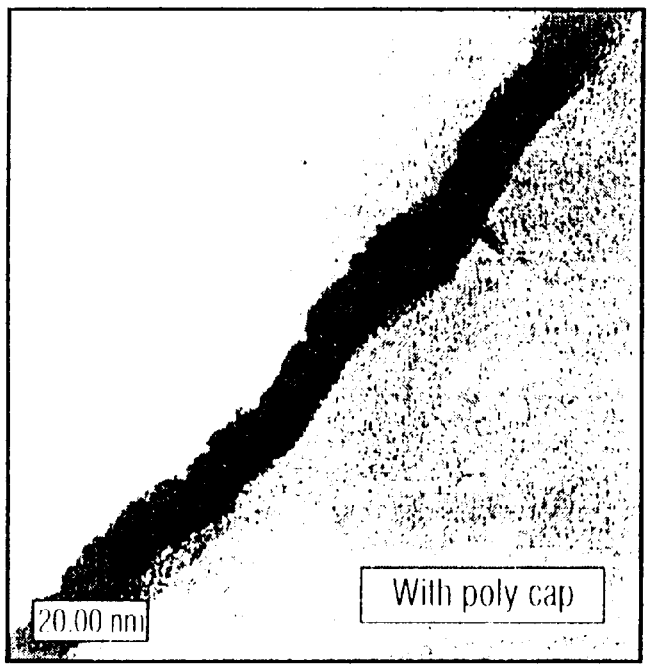
FIG. 2a is a transmission electron microscope photograph of a layered structure with a polysilicon adhesion layer.

Several examples of the invention will now be described with detailed reference to the figures of the drawing.

EXAMPLE 1 a) Fabrication of a P-Doped Polycrystalline Silicon Layer:

A layer composed of polycrystalline polysilicon (poly-Si) which has been doped with phosphorus is deposited on a gate oxide layer ($SiO_2$) of a wafer by means of chemical vapor deposition (CVD). Silane ($SiH_4$) serves as starting compound for the polycrystalline silicon. Phosphane ($PH_3$) is added to the process gas for the purpose of doping. In order to achieve a satisfactory degree of homogeneity of the doping over the entire wafer, the addition is carried out according to a concentration gradient, starting with 10% $PH_3$, related to the final concentration of the phosphane, and rising to 100%, alternately in step lengths of 2 and 3 seconds. Subsequently, the deposition is continued until the desired layer thickness has been attained. After the desired layer thickness has been attained, the addition of phosphane in the process is terminated. The result is that a layer of undoped polysilicon is deposited on the doped polysilicon. The layer of undoped polysilicon improves the adhesion of the tungsten silicide layer which is then applied.

The entire layer thickness of doped and undoped polysilicon is approximately 200 nm. The process parameters are given in Table 1. "Deposition time, doped" corresponds to the deposition time for the doped polysilicon layer, "deposition time, undoped" corresponds to that for the deposition of undoped polysilicon onto the doped layer.

b) Fabrication of Tungsten Silicide Layer on Polysilicon Layer:

The wafer coated in accordance with Example 1a) is transferred into a different chamber of the same CVD reactor without the vacuum in the CVD reactor being eliminated.

Before a coating series is started, the chamber is conditioned in a so-called precoat method without a wafer by also adding silane in addition to the process gases of tungsten hexafluoride and dichlorosilane. The silane presumably leads here to the formation of catalytic species which promote the reaction of $WF_6$ and $SiH_2Cl_2$. The first wafer should be fed into the conditioned chamber not later than 10 minutes after the conditioning.

The conditions for the deposition of the tungsten silicide layer are compiled in Table 1. The thickness of the deposited tungsten silicide layer is approximately 170 nm.

TABLE 1

| Working step | Parameter | Value | Unit |
| --- | --- | --- | --- |
| Target | Thickness of poly-Si | 200 +/− 20 | nm |
| Target | Resistance of layer | 100 +/− 40 | Ohm/Sq |
| Target | Stressing of layer | <300 | MPa |
| Poly-Si deposition | Pressure | 80 | Torr |
| | Temperature | 660 | ° C. |
| | Deposition time, doped | 22 + 85 | sec |
| | Deposition time, undoped | 18 | sec |
| | $H_2$ flow rate, main | 4.9 | slm |
| | $H_2$ flow rate, slotted valve | 4.6 | slm |
| | $SiH_4$ flow rate | 0.5 | slm |
| | $PH_3$ flow rate | 45 | sccm |
| Target | Thickness of $WSi_x$ | 170 +/− 25 | nm |
| Target | Resistance of layer | 45 +/− 6.5 | Ohm/Sq |
| Target | Stressing of layer | <1300 | MPa |
| $WSi_x$ deposition | Pressure | 1 | Torr |
| | Temperature | 550 | ° C. |
| | Nucleation time | 20 | sec |
| | Deposition time | 90 | sec |
| | Time for $SiH_4$ | 10 | sec |
| | $WF_6$ flow rate | 3.5 | sccm |
| | Ar flow rate, top | 0.85 | slm |
| | Ar flow rate, bottom | 700 | sccm |

After the above process steps a) and b) have been carried out, a wafer is obtained on whose gate oxide layer firstly a layer of p-doped polysilicon with a boundary layer composed of undoped polysilicon and then a layer of tungsten silicide are deposited.

Both coating steps can be carried out in direct succession in a CVD system, making fabrication possible in a very easy, quick and cost-effective way. In addition, the method according to the invention gives rise to layers of outstanding homogeneity with an extremely low proportion of impurities.

Referring now more specifically to FIG. 1, there are shown SIMS spectra (SIMS=Secondary Ion Mass Spectroscopy) which represent the concentration profiles of carbon and oxygen in the boundary region between a polysilicon layer and a tungsten silicide layer. The concentration is plotted on the y axis, while the x axis corresponds to the thickness of the layer. A thickness of 0 nm corresponds to the outer surface of the tungsten silicide layer. As the thickness of the layer and the penetration depth into the layered structure increase, the polysilicon layer is approached. The interface between the two layers lies at approximately 170 nm.

The thin lines represent the condition in a wafer which has been coated in accordance with the method according to the invention. The thick lines correspond to the condition in a wafer which has been coated and doped according to a conventional method.

FIG. 1 shows that both the oxygen concentration and the carbon concentration which are found in the boundary region between the polysilicon layer and tungsten silicide layer are, in the case of the conventionally fabricated wafer, approximately 10% greater than in the case of wafers coated according to the invention. The method according to the invention therefore permits a drastic reduction in impurities in the boundary region between polysilicon and tungsten silicide.

Figure 2B:
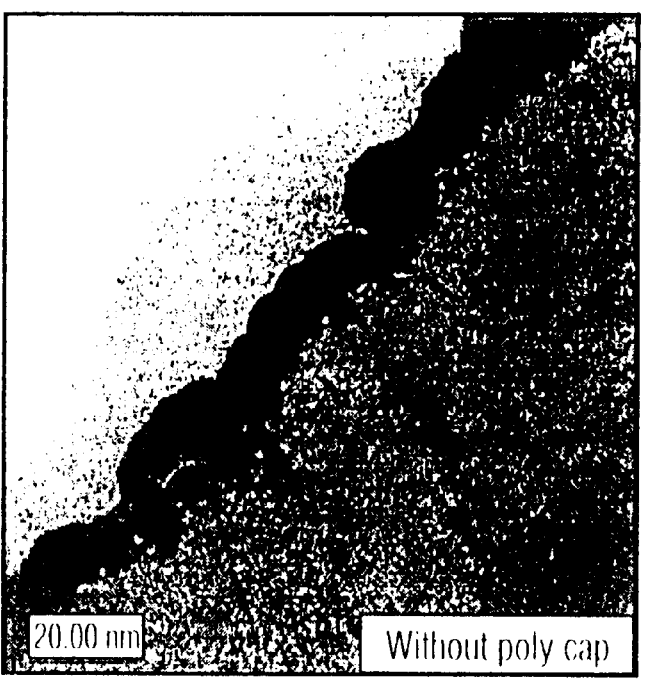
FIG. 2b is a transmission electron microscope photograph of a layered structure without a polysilicon adhesion layer.

FIG. 2 illustrates the advantages which can be obtained with the method according to the invention by depositing a boundary layer composed of undoped polysilicon between the doped polysilicon layer and metal silicide layer. The transmission electron microscope photographs show a layered structure composed of polysilicon and metal silicide and produced by means of CVD. The metal silicide nucleation layer ($WSi_x$) is the dark layer. In FIG. 2a, an approximately 30 nm thick layer composed of undoped polysilicon has been deposited on the doped polysilicon. The nucleation has taken place in a very homogeneous way here. In contrast, FIG. 2b, in which there is no cap composed of undoped polysilicon, shows microholes in the region between the polysilicon and tungsten silicide. The nucleation of the tungsten silicide on the doped polysilicon is impeded here.

With the method according to the invention, layered structures whose layers have an excellent degree of homogeneity and whose impurity content is extremely low can be fabricated in a very simple, effective and economical way. In addition, it is possible to fabricate doped polysilicon layers with a uniform distribution of the doping atoms over the entire deposited area. The adhesion of additional layers on the doped polysilicon layer is good, since an undoped polysilicon boundary layer is applied. Separate cleaning and implantation steps are not necessary. The uniform distribution of the doping atoms and the high degree of homogeneity of the layers in the layered structure fabricated according to the invention also permit precise structuring of these layers. Particularly advantageous results can be achieved if the structuring of the layered structures is carried out by means of the structuring method according to the invention explained below.

EXAMPLE 2

Structuring a Layered Structure With a Tungsten Silicide Layer and a Doped Polysilicon Layer The layered structure which has been fabricated in accordance with Example 1 and in which a p-doped polysilicon layer and a tungsten silicide layer have been deposited on a gate oxide layer is structured by means of plasma etching after a hard mask has been applied. The hard mask is composed of a silicon dioxide layer which has been produced in a usual way by depositing tetraethoxysilane and, after the application of a resist mask, structuring it with argon, trifluoromethane and oxygen. The mask has the structure of interwoven lines with a width of 0.46+/−0.07 µm.

The tungsten silicide layer has a thickness of 170 nm, and the polysilicon layer has a thickness of 200 nm. The etching method for the tungsten silicide and polysilicon layers is carried out in a different chamber of the same plasma etching device which has been used for structuring the hard mask.

In the first etching step (breakthrough), an etching gas composed of $NF_3$, HCl, $Cl_2$ and $He/O_2$ is used. Details of the etching method can be found in the following Table 2.

The first step is carried out until approximately 75% of the tungsten silicide layer has been removed. In the second step (main etch), the rest of the tungsten silicide layer and the polysilicon layer is removed to a remainder of approximately 50 nm thickness. The end point of the etching step is expediently determined using OES (cf. Example 3a). HCl, $Cl_2$ and $He/O_2$ are used as etching gas. Subsequently, the rest of the polysilicon layer is etched away with HBr, $He/O_2$. This step, referred to as overetching step, is very selective and takes place virtually without damaging the gate oxide lying underneath the polysilicon layer. Before the insertion of the next wafer to be structured, the etching chamber is cleaned with a silicon dummy.

After the etching method, the structured wafer is cleaned by immersion in a diluted aqueous HF solution for 60 seconds.

TABLE 2

| Working step | Parameter | Value | Unit |
|---|---|---|---|
| Breakthrough | Pressure | 20 | Torr |
| | Power | 500 | Watt |
| | HCl flow rate | 15 | sccm |
| | $Cl_2$ flow rate | 90 | sccm |
| | $NF_3$ flow rate | 15 | sccm |
| | $He/O_2$ flow rate | 15 | sccm |
| | He; reverse side | 9.5 | Torr |
| | Time | 20 | sec |
| | B sector | 20 | Gauss |
| Main etch | Pressure | 20 | mtorr |
| | Power | 500 | Watt |
| | HCl flow rate | 18 | sccm |
| | $Cl_2$ flow rate | 110 | sccm |
| | $He/O_2$ flow rate | 10 | sccm |
| | He; reverse side | 9.5 | torr |
| | Time | 35 | sec |
| | B sector | 20 | Gauss |
| Over etching | Pressure | 50 | mtorr |
| | Power | 175 | Watt |
| | HBr flow rate | 80 | sccm |
| | $He/O_2$ flow rate | 8 | sccm |
| | He; reverse side | 9.5 | torr |
| | Time | 140 | sec |

The advantageous results of the structuring method according to the invention are explained with reference to the following figures.

FIG. 3 gives a comparison of word lines which have been structured in accordance with the structuring method of the invention, on the one hand, and in accordance with a two-step standard etching method, on the other hand. FIGS. 3a and 3b show word lines in the region of the center of the wafer, FIGS. 3c and 3d show the same at the extreme edge of the wafer. The word lines fabricated according to the standard etching method are shown in FIGS. 3a and 3c.

The word lines fabricated in this way occur as a result of undercutting in the tungsten silicide and as a result of asymmetric edges. The latter feature can be seen in particular in FIG. 3c, which is due, inter alia, to the fact that the wafer was held with a clamp ring during the etching. Such asymmetric edges can, in extreme cases, lead to short circuits between the gate conductor (GC) and the deep trench (DT).

Such GC/DT short circuits do not occur with word lines which have been etched using the method according to the invention.

Figure 3A:
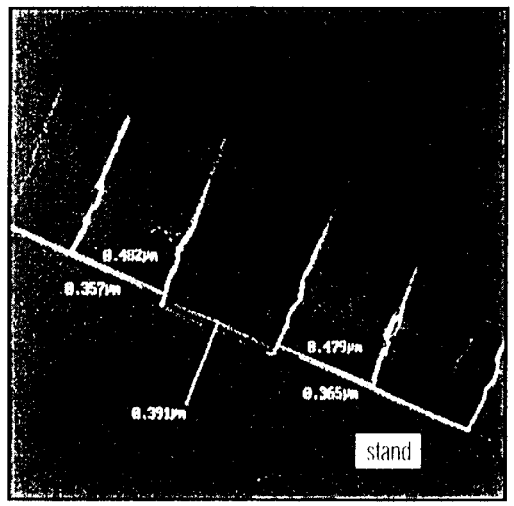
FIGS. 3a–3d are representations of structured word lines produced with the structuring method according to the invention, at the center of the wafer and at the edge of the wafer, compared with corresponding word lines produced with a conventional etching method.
Figure 3B:
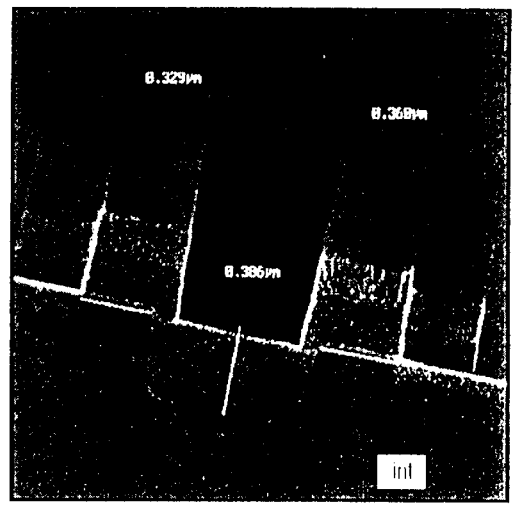
Figure 3C:
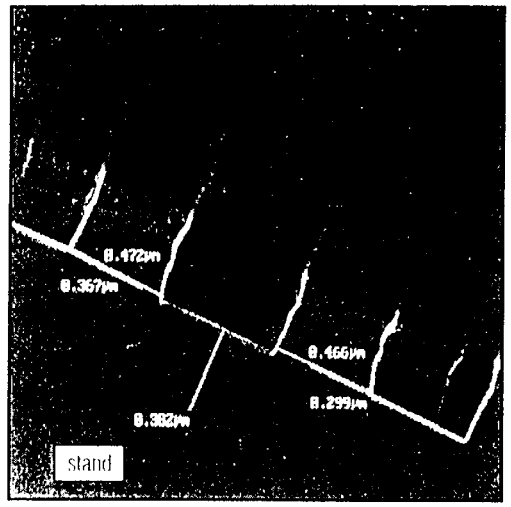
Figure 3D:
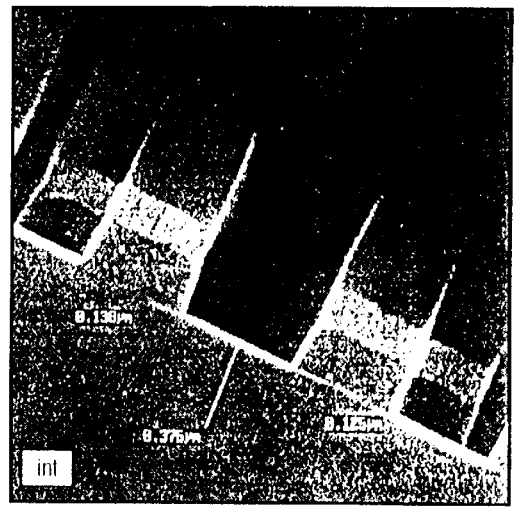

Undercuts are not observed, and symmetrical edges are obtained as shown in FIGS. 3b and 3d. Table 3 illustrates the results with reference to GC/DT values for a number of selected semiconductor wafers. The first five values relate to the structuring method according to the invention and the rest to the standard method. The measured values show clearly that so-called hard faults as a result of short circuits between the gate conductor (GC) and deep trench (DT) do not occur with the method according to the invention (1=100% fault-free), while the fault rate with the standard method is 97% on average. The reason for the improved results obtained with the structuring method according to the invention is the fabrication of straight-etched edges and improved overetching in which the polysilicon is removed completely in the desired regions with a high degree of selectivity and homogeneity over the entire wafer surface. Particularly good results can be achieved if the wafer is held electrostatically during the etching procedure.

TABLE 3

| Wafer/group/batch | | |
|---|---|---|
| | Invention/standard | GC/DT |
| 2 | Invention | 1 |
| 6 | " | 1 |
| 10 | " | 1 |
| 16 | " | 1 |
| 20 | " | 1 |
| 1 | Standard | 0.963 |
| 5 | " | 0.981 |
| 11 | " | 0.963 |
| 15 | " | 0.945 |
| 21 | " | 0.981 |
| 23 | " | 0.972 |
| 25 | " | 0.963 |

Figure 4:
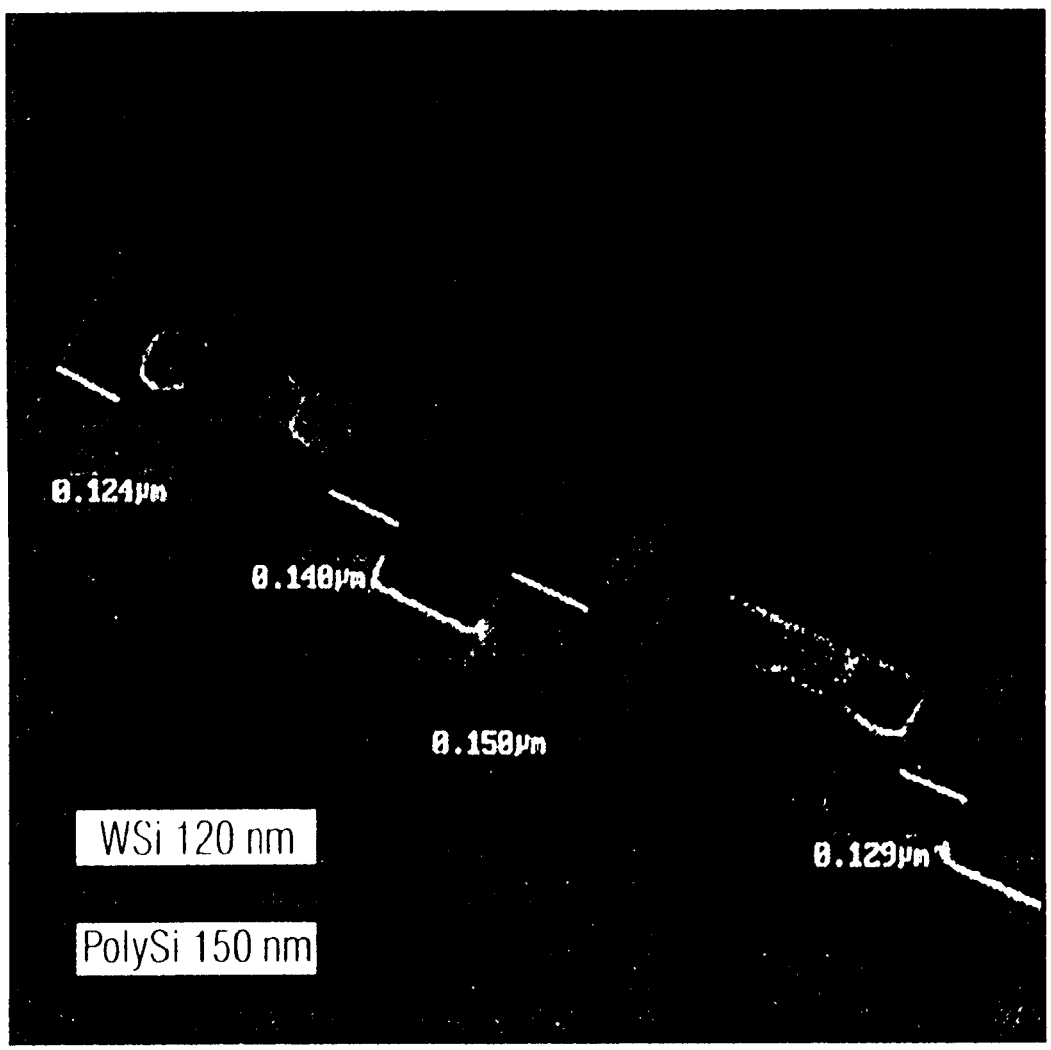
FIG. 4 is a representation of structured word lines produced with the structuring method according to the invention.

FIG. 4 illustrates how the structuring method according to the invention can be used even if the layer thickness of the respective layers in the layered structure is reduced. In comparison with the layer thicknesses of 200 nm for the polysilicon and 170 nm for tungsten silicide which are usual in the standard method, in the layered structure shown the layer thicknesses are reduced to 120 nm for the tungsten silicide and 150 nm for the polysilicon. Overall, the layer thickness of the layered structure can thus be reduced by 100 nm in comparison with the layered structures which are usually used, without dropping quality. When the layered structure is filled up with further layers or metallization layers, considerably larger room for maneuver is available than in the past.

Figure 5A:
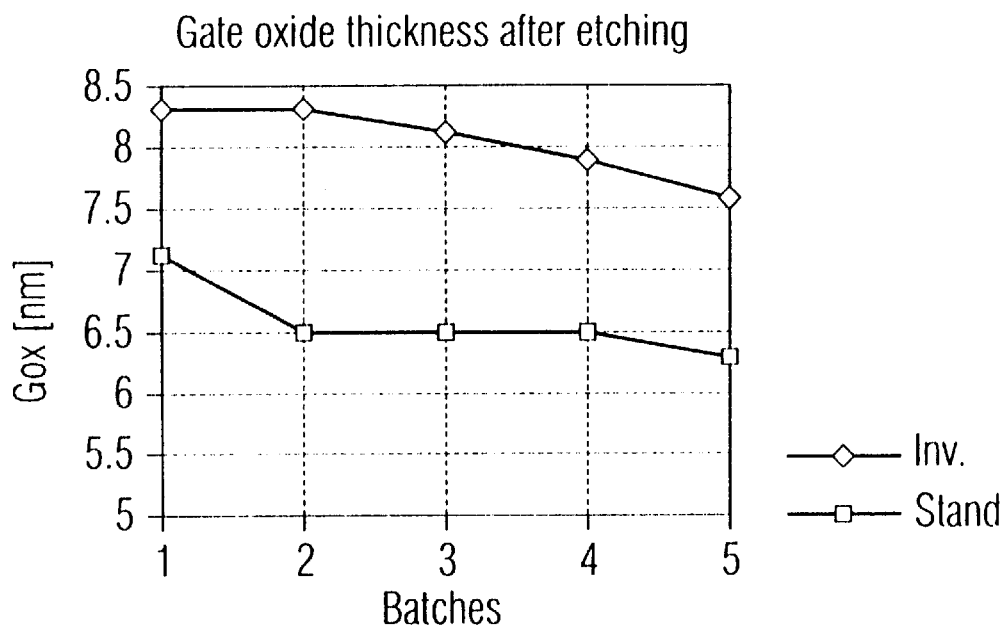
FIG. 5a is a chart comparing the thickness of the gate oxide after the etching in accordance with the structuring method according to the invention and in accordance with a conventional method.
Figure 5B:
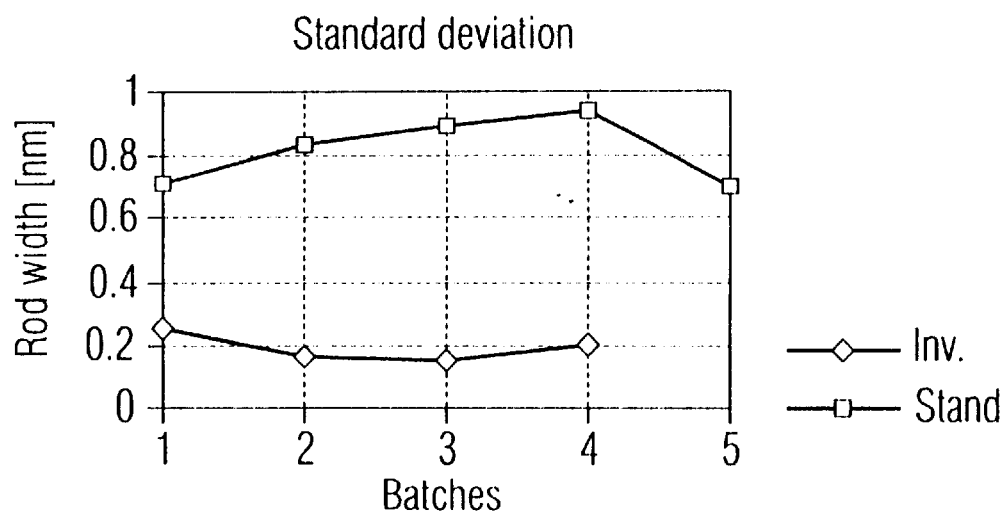
FIG. 5b is a similar view, comparing the associated standard deviations.

FIG. 5a shows the thickness of the gate oxide layer (Gox), which is disposed underneath the polysilicon layer in the layered structure to be structured, after etching in accordance with the two-step standard method and in accordance with the structuring method according to the invention. FIG. 5b indicates the standard deviations which are associated with the results of FIG. 5a.

FIG. 5a proves that the gate oxide is attacked to a much smaller degree as a result of the structuring method according to the invention than as a result of the standard method. The thickness of the gate oxide is approximately 1 nm greater in accordance with the structuring method according to the invention than with conventional structuring. This means that the product obtained in accordance with the method according to the invention is significantly less prone to leakage currents which may occur with an excessively thin gate oxide layer. The electrical properties of the chip can be improved overall. As a result of the very selective etching by means of the method according to the invention, it is therefore possible to reduce the thickness of the gate oxide layer, and thus to decrease further the overall height of the layered structure to be structured.

EXAMPLE 3

Determining End Points by Optical Emission Spectroscopy

The determination of end points for the etching method described in Example 2 will be explained in more detail below with reference to the example of the main etch and overetching steps.

Basically, optical emission spectroscopy (OES) is based on the fact that the emission of an etching compound or one of the etching products is observed over the course of the etching step. The emission of the selected compound is proportional to its concentration, which in turn provides information on the progress of the etching procedure.

Figure 6:
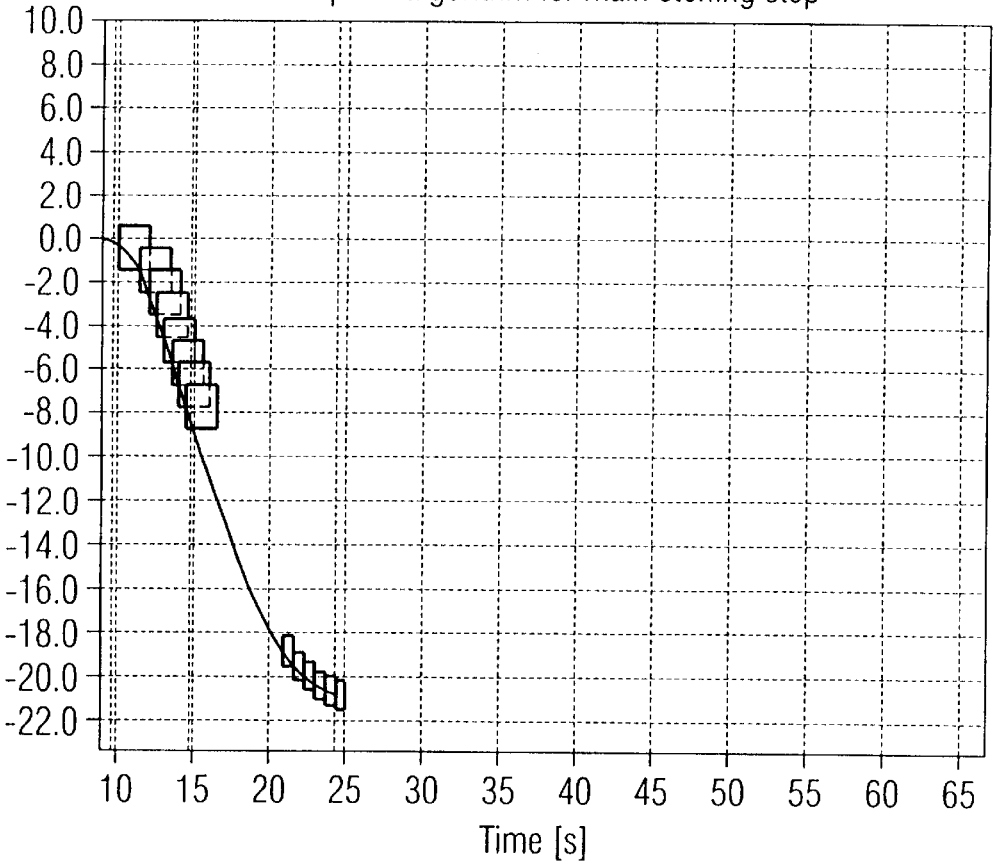
FIG. 6 is a graph chart illustrating the determination of end points in the main etch step according to the invention using optical emission spectroscopy.
Figure 7:
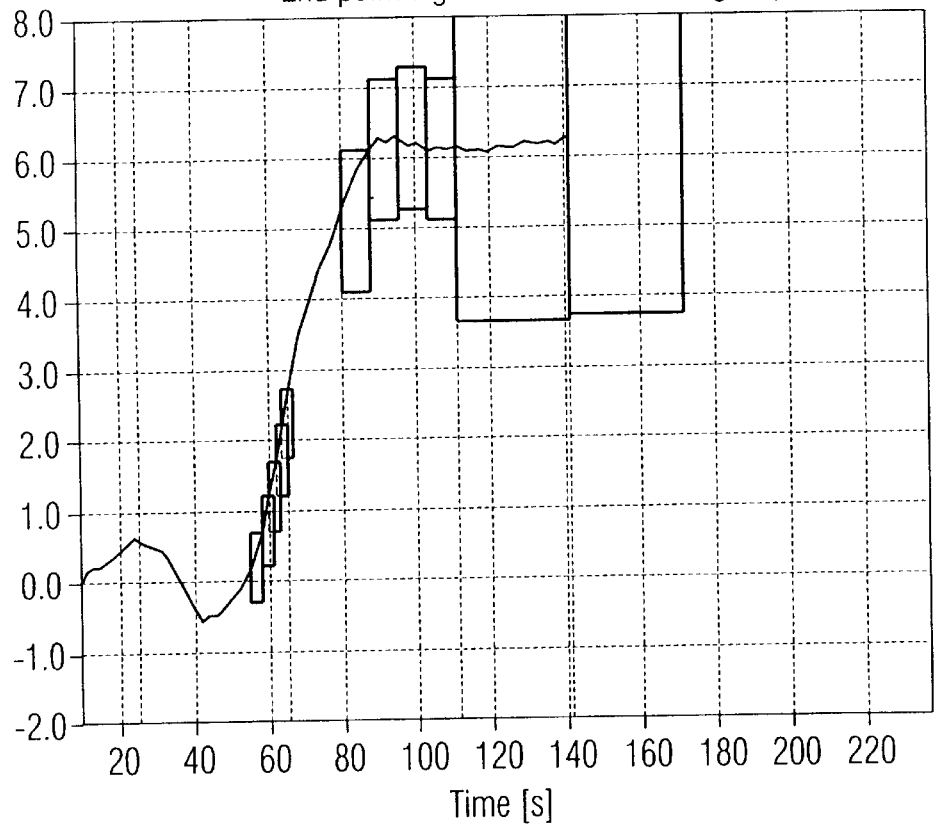
FIG. 7 is a similar view illustrating the end point algorithm for the overetch step.

The device for determining the optical emission can correspond basically to the devices usually used for this purpose. Preferably, the light emitted from the etching chamber is directed onto a monochromator via a window in the chamber using an optical wave guide. Using a suitable spectrometer, the light emitted is then measured at a wavelength which is characteristic of the substance to be detected. The spectrum which is emitted in the course of the etching procedure is compared with an algorithm prescribed for the respective etching procedure. When the prescribed end point is reached, the etching procedure is terminated. FIGS. 6 and 7 show, by way of example, two end point algorithms for the main etching and/or overetching step.

a) Determining End Points for the Main Etching Step

In the main etching step, as described above, a large part of the polysilicon layer is etched. In the layered structure described in Example 2, the polysilicon layer is a tungsten-doped layer. The etchant is a chlorine-containing etching gas.

In this etching step it is decisive that a remainder of the polysilicon layer is not etched. If none of the residual layer, which is etched away in a subsequent etching step with bromine-containing etching gas, was retained it would not be possible to prevent the gate oxide being attacked.

If, as is usual, interference measurement was used for determining the end points in the main etching step, it would be possible to detect only the complete etching away of the polysilicon layer. On the other hand, the OES used according to the invention permits the end point to be determined in such a way that a remainder of the polysilicon layer is retained. In fact, OES spectra for the main etch method basically have a curved profile with a flattening at a low residual layer thickness. The end point is determined according to the invention in such a way that it occurs in the region of this flattening of the curve.

In practice, the optical emission of the doping substance tungsten was determined at 4705 nm. The tungsten implanted into the polysilicon is etched in the main etching step together with the polysilicon, and thus flows into the vapor in the etching chamber. In the course of the main etching step, the concentration of the tungsten declines continuously and, correspondingly, the emission measured for the tungsten becomes lower. The end point algorithm, which is represented in FIG. 6, was defined in accordance with this profile. In this context, a measured variable which is proportional to the light intensity is plotted on the y axis and the time in seconds is plotted on the x axis.

In particular, at the start of the curve, eight windows with a height corresponding to 1 virtual unit and a width of 2 seconds were defined. The end point of the etching procedure was defined by five windows of 0.65 virtual units in height and 0.7 seconds in width, which were specified in such a way that a residual layer thickness of 50 nm polysilicon was retained. Other residual layer thicknesses can easily be set by suitably defining the windows.

During the etching procedure, the actual profile of the measured emission spectrum is compared with the algorithm, and the etching procedure is terminated when the last of the five windows described in the flattened part of the curve has been passed through. In this way, it is possible to achieve a defined stop of the main etching step at a previously defined residual layer thickness.

b) Determining End Points for the Overetching Step

As described in Example 2, the residual thickness of the polysilicon which is not etched away in the main etching step is removed according to the invention with a bromine-containing etching gas.

The determination of the end points using OES is carried out basically as described above. The emission caused by the hydrogen bromide etching agent serves as measured variable. Here too, the wavelength to be measured is (randomly) 4705 nm.

Since there is no longer any tungsten in the overetching step, there is, however, consequently no falsification of the results.

The curve profile in the overetching step is different from that in the main etching step. As long as there is still a residual layer of polysilicon, hydrogen bromide is consumed during the etching. Its concentration in the gas is therefore comparatively low. As the etching step progresses, the consumption of HBr declines however, and the concentration of hydrogen bromide in the vapor and its emission therefore increases. When the polysilicon has been completely etched away, the concentration of hydrogen bromide remains constant at a high level. According to the invention, the end point of the overetching step is placed in this flattened region of the curve.

FIG. 7 shows a corresponding end point algorithm. The units of the x axis and y axis correspond to those in FIG. 6. In the illustrated example, the curve profile is defined by five windows in the rising region of the curve and four plus one windows in the flattened end region.

The position and size of the windows can be determined in a manner known per se by means of a number of test passes.

In the manner shown, the overetching step on the gate oxide can be stopped, and damage to the gate oxide by the etching agent can thus be avoided.

We claim:

1. A method of producing a doped layer primarily composed of polycrystalline silicon, which comprises:
    forming a polycrystalline silicon layer on a substrate by chemical vapor deposition and doping the layer by adding a doping compound to a process gas during the chemical vapor deposition; and
    doping only during a determined deposition period in the forming step and terminating a feed of the doping compound to the process gas while continuing the chemical vapor deposition and forming a separate layer of undoped silicon as a contiguous boundary layer to the doped polysilicon layer, and increasing a concentration of the doping compound, relative to an overall concentration of compounds to be deposited, during the vapor deposition.

2. The method according to claim 1, which comprises selectively adding forming steps and fabricating layered structures comprising a doped polysilicon layer with a doped region and a contiguous, substantially undoped region.

3. The method according to claim 2, wherein the doping compound is selected from the group consisting of diborane ($B_2H_6$), trimethylboron ($B(CH_3)_3$), phosphine ($PH_3$) or arsine ($AsH_3$).

4. The method according to claim 1, wherein the doping compound is a gaseous or highly volatile compound selected from the group consisting of boron, gallium, indium, phosphorus, arsenic, and antimony.

5. The method according to claim 1, which comprises, in the doping step, decreasing a concentration of the doping compound, relative to an overall concentration of compounds to be deposited, during the vapor deposition.

6. The method according to claim 1, which comprises, in the doping step, maintaining a concentration of the doping compound constant, relative to an overall concentration of compounds to be deposited, and increasing the overall concentration of the compounds to be deposited during the vapor deposition.

7. The method according to claim 1, wherein the forming step comprises forming the doped polysilicon layer directly on a gate oxide layer.

8. The method according to claim 1, which further comprises depositing a layer of a material selected from the group consisting of metal and metal silicide on the silicon boundary layer.

9. The method according to claim 8, wherein the depositing step is performed in a different chamber of a device for chemical vapor deposition in which the forming step is performed.

10. The method according to claim 8, which further comprises forming an insulation layer on the metal layer or metal silicide layer.

11. The method according to claim 10, wherein the insulation layer is a silicon dioxide layer.

12. The method according to claim 8, wherein the doping step is performed in vacuum and the vacuum is maintained between the deposition of the doped polysilicon layer and the deposition of the metal or metal silicide layer.

13. The method according to claim 1, which further comprises depositing a layer of a metal silicide selected from the group of cobalt silicide, titanium silicide, tantalum silicide, molybdenum silicide and tungsten silicide.

14. The method according to claim 1, wherein at least one of the forming and doping steps is performed in vacuum.

15. The method according to claim 1, wherein, in the doping step, keeping the ratio of the doping compound and Si-containing compound constant with respect to one another, but increasing the proportion of the doping compound and Si-containing compound in the gas continuously or incrementally in the course of the deposition.

16. A method of producing a doped layer primarily composed of polycrystalline silicon, which comprises:
    forming a polycrystalline silicon layer on a substrate by chemical vapor deposition initially depositing pure silicon and subsequently doping the layer by adding a doping compound to a process gas during the chemical vapor deposition; and
    doping only during a determined deposition period in the forming step and terminating a feed of the doping compound to the process gas while continuing the chemical vapor deposition and forming a separate layer of undoped silicon as a contiguous boundary layer to the doped polysilicon layer, and increasing a concentration of the doping compound, relative to an overall concentration of compounds to be deposited, during the vapor deposition.

17. The method according to claim 16, wherein, in the doping step, the doping compound is firstly added to the quantity corresponding to the desired final concentration of doping atoms in the silicon, and then increasing the proportion of silicon-containing compound in the gas stream as the vapor deposition progresses.

* * * * *